United States Patent [19]

Hong et al.

[11] 4,239,991

[45] Dec. 16, 1980

[54] CLOCK VOLTAGE GENERATOR FOR SEMICONDUCTOR MEMORY

[75] Inventors: Ngai H. Hong, Galveston; Edmund A. Reese, Sugar Land, both of Tex.

[73] Assignee: Texas Instruments Incorporated, Dallas, Tex.

[21] Appl. No.: 940,222

[22] Filed: Sep. 7, 1978

[51] Int. Cl.³ .................... H03K 5/135; H03K 17/16; H03K 17/284
[52] U.S. Cl. .................................. 307/262; 307/246; 307/251; 307/DIG. 4
[58] Field of Search ............... 307/208, 246, 251, 262, 307/270, 269, DIG. 1, DIG. 4, DIG. 5

[56] References Cited

U.S. PATENT DOCUMENTS

| | | | |
|---|---|---|---|
| 3,675,043 | 7/1972 | Bell | 307/208 X |
| 3,769,528 | 10/1973 | Chu et al. | 307/270 |
| 3,774,055 | 11/1973 | Bapat | 307/208 X |
| 3,806,738 | 4/1974 | Chin | 307/304 X |
| 4,063,117 | 12/1977 | Laugesen | 307/DIG. 4 X |
| 4,071,783 | 1/1978 | Knepper | 307/246 X |
| 4,090,096 | 5/1978 | Nagami | 307/DIG. 4 X |
| 4,122,361 | 10/1978 | Clemen et al. | 307/DIG. 4 X |
| 4,129,794 | 12/1978 | Dickson et al. | 307/DIG. 4 X |
| 4,149,099 | 4/1979 | Nagami | 307/270 X |

FOREIGN PATENT DOCUMENTS 2340770 2/1975 Fed. Rep. of Germany .... 307/DIG. 4

OTHER PUBLICATIONS

Boss et al., "Powering Delay Circuit"; *IBM Tech. Discl. Bull.*, vol. 16, No. 1, pp. 17–18, 6/1973.
West, "Practical Circuit Design Using M.O.S."; *Design Electronics*, pp. 30–32, 37–38; 3/1971.
Arzubi et al., "MOS Driver With Internal Feedback"; *IBM Tech. Discl. Bull.;* vol. 19, No. 10, pp. 3765–3766; 3/1977.
Lee et al., "Low–Power Dissipation FET Driver Circuit"; *IBM Tech. Discl. Bull.*, vol. 14, No. 4, p. 1084; 9/1971.

*Primary Examiner*—Larry N. Anagnos
*Attorney, Agent, or Firm*—John G. Graham

[57] ABSTRACT

A clock generator for producing internal waveforms for an MOS dynamic RAM or the like provides a preselected delay period between input and output clocks. A pair-delay circuit including two transistor stages produces the desired delay; a driver circuit provides the necessary high level output. A pair of series transistors in the output of the pair-delay, with the node between the series transistors being precharged, provides a more precise control of the delay over a wide range, and the waveshape of the input to the driver is improved.

9 Claims, 7 Drawing Figures

CLOCK VOLTAGE GENERATOR FOR SEMICONDUCTOR MEMORY

BACKGROUND OF THE INVENTION

This invention relates to circuits using MOS or insulated gate field effect transistors, and more particularly to circuits for generating clock waveforms.

Semiconductor memory devices such as the widely used 4 K, 16 K or 64 K dynamic MOS RAMs employ a large number of clock voltages which are generated on the chip itself. An external clock such as a chip enable clock or a row or column address strobe is used to initiate a series of internal clocks which have a wide variety of different delay times. In some cases, as many as twenty to twenty-five internal clocks are needed for the circuitry in a dynamic RAM chip. The delay periods must be precise, and the rise and/or fall rates correct. The output level usually needs to be a full supply level rather than a threshold lower than the supply voltage, and often the clock must drive a rather large capacitive load. Power dissipation is always a factor since the dissipation of the chip must be kept to a minimum, particularly when standby operation is provided.

It is the principal object of this invention to provide an improved clock voltage generator for a semiconductor device. Another object is to provide a clock generator for an MOS integrated circuit which includes a precise control of the delay between an input clock and an output clock, as well as a predetermined waveshape.

SUMMARY OF THE INVENTION

In accordance with one embodiment of the invention a clock generator for producing internal waveforms for an MOS dynamic RAM or the like provides a preselected delay period between input and output clocks. A pair-delay circuit including two transistor stages produces the desired delay; a driver circuit provides the necessary high level output. A pair of series transistors in the output of the pair-delay, with the node between the series transistors being precharged, provides a more precise control of the delay over a wide range, and the waveshape of the input to the driver is improved.

BRIEF DESCRIPTION OF THE DRAWINGS

The novel features believed characteristic of the invention are set forth in the appended claims; the invention itself, however, as well as other features and advantages thereof, will best be understood by reference to the following detailed description of a particular embodiment, read in conjunction with the accompanying drawings, wherein:

DETAILED DESCRIPTION OF SPECIFIC EMBODIMENT

Figure 1:
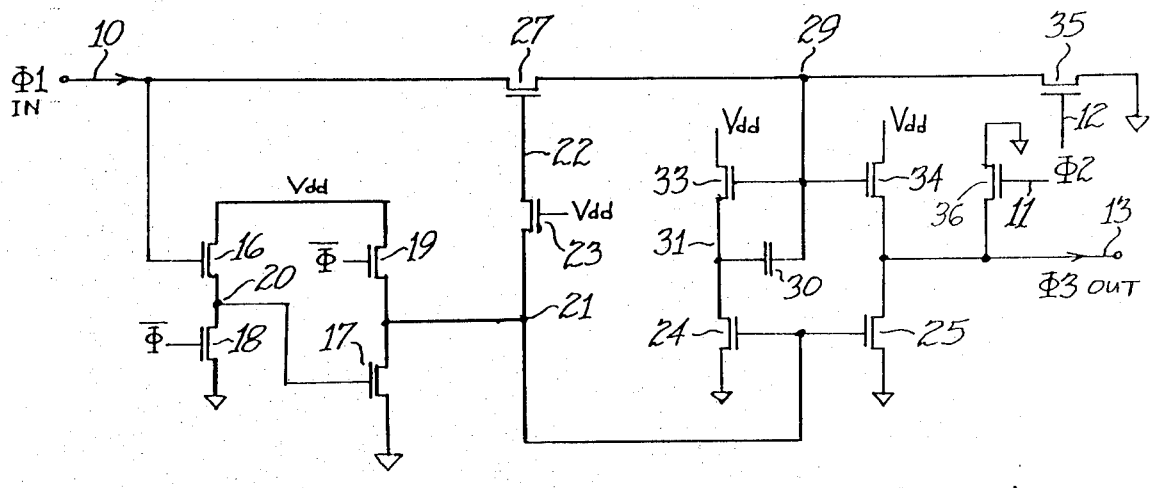
FIG. 1 is an electrical schematic diagram of a prior art clock generator circuit.

With reference to FIG. 1, a prior art clock generator circuit will be described; the present invention is an improvement on this circuit to solve some of the inherent problems as will be explained.

Figure 2:
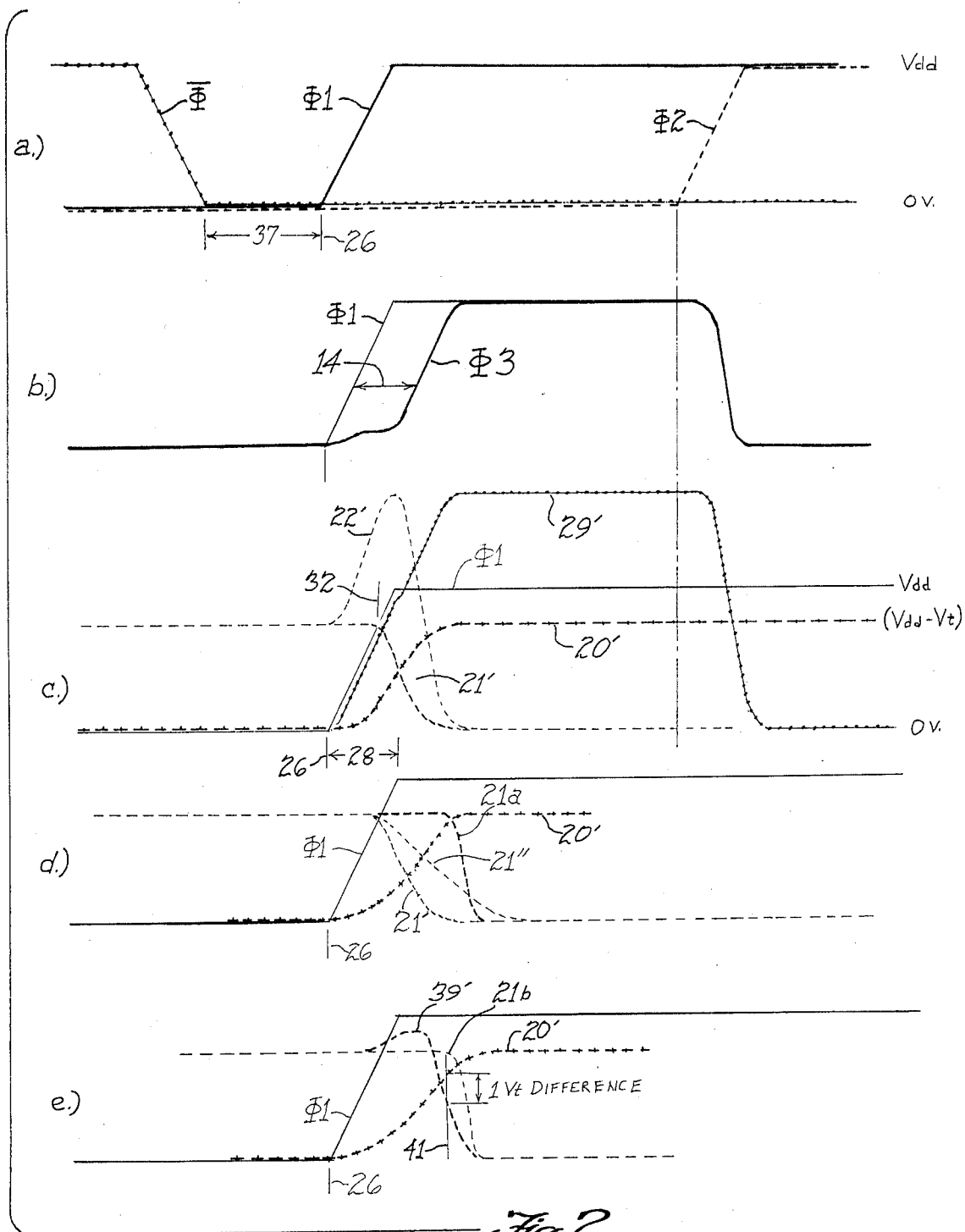
FIG. 2a-2e are graphic representations of voltage waveforms appearing at various points in the circuit of FIG. 1 as well as in the circuit of FIG. 3.

The clock generator circuit of FIG. 1 receives a clock input $\phi1$ at an input terminal 10, and receives a second clock input $\phi2$ at input terminals 11 and 12 to produce a clock output $\phi3$ at an output terminal 13. The leading edge of the output $\phi3$ is delayed by a time period 14 from the leading edge of the input $\phi1$, as seen in FIGS. 2a and 2b; this delay is introduced by a pair of stages including the transistors 16 and 17. The output $\phi3$ terminates when the input $\phi2$ goes high, so the trailing edge of $\phi3$ almost coincides with the leading edge of $\phi2$.

In the delay part of the circuit, a pair of transistors 18 and 19 having their gates driven by $\overline{\phi}$ function to discharge a node 20 to Vss before an operating cycle begins, and to charge a node 21 to (Vdd-Vt). A node 22 is also precharged to (Vdd-Vt) via an isolating transistor 23. The remainder of the circuit functions as a driver. The node 21, precharged high, holds the gates of transistors 24 and 25 high during $\overline{\phi}$. So long as the transistor 25 is conductive the output 13 is held low. When the input $\phi1$ starts to go high at time 26, the node 22 is booted by the gate to drain capacitance of the transistor 27. The voltage on the node 22 is seen in FIG. 2c as a line 22'; this voltage stays high throughout the period 28 which is the rise time of the input $\phi1$, so the transistor 27 stays in the triode region of operation during this period. As a result, the voltage on a node 29, seen in FIG. 2c as a line 29', will almost track the leading edge of the input $\phi1$. This voltage 29' charges a bootstrap capacitor 30 in the driver stage to the Vdd level, and primes the driver stage so that it may produce an output when the voltage 21' on the node 21 discharges. During the rise time 28 for $\phi1$ the node 21 remains high due to the delay in charging the gate of the transistor 17 through the transistor 16. This holds the node 31 and output 13 down because the transistors 24 and 25 are held on, allowing the capacitor 30 to charge through the transistor 24. The transistor 23 is maintained near cutoff so charge will not be lost from the node 22 during the period 28. Near the end of the rise time 28, approximately at a time 32, the node 21 begins to be discharged by the input $\phi1$ propagating through the delay transistors 16 and 17, as seen by the line 21' of FIG. 2c. This discharges the node 22 through the transistor 23, seen by the line 22', so the transistor 27 turns off and the node 29 is isolated with a voltage of about Vdd at this time as seen by the line 29'. When the node 21 discharges, the transistors 24 and 25 turn off, and so the node 31 and the output 13 can rise quickly toward Vdd by conduction through the transistors 33 and 34. As the node 31 goes toward a higher voltage, the node 29 is boosted to a level higher than Vdd via the capacitor 30. This causes the drop across the transistor 34 to be virtually zero, so the output 13 goes to Vdd.

The circuit is reset by the input $\phi2$ which occurs before $\overline{\phi}$ goes high for the next cycle. If the circuit need not be reset prior to $\overline{\phi}$, then the $\phi2$ inputs 11 and 12 are not needed. When $\phi2$ goes high, the transistor 35 is turned on by the input 12 and this discharges the node 29, turning off the transistors 33 and 34. At the same time, the $\phi2$ input 11 turns on a transistor 36, discharging the output 13 quickly to Vss.

Several disadvantages exist in the prior art circuit of FIG. 1. These have been corrected in the present invention as will be explained.

First, the delay circuit including the pair of transistors 16 and 17 is inadequate for good control over the delay time 14. This is because the transistor 17 starts to turn on as soon as its gate voltage exceeds its threshold voltage, regardless of the device sizes. Thus, if the transistor 16 is made small and the transistor 17 is made large to create more delay, the voltage on the node 21 will start to discharge starting at about the same time as previously. This is illustrated in FIG. 2d where the line 21' is the voltage on the node 21 with a given size ratio for the transistors 16 and 17 and the line 21" is the voltage with transistor 16 smaller and transistor 17 larger. Note that the fall time is slower, whereas the desired waveshape is the dotted line 21a. The voltage on the node 20, the gate of the transistor 17, is shown by a line 20'; as soon as this voltage reaches Vt, about 0.8 volts, the transistor 17 begins to conduct and discharges the node 21.

Secondly, in some applications of the clock generator circuit of FIG. 1, the time period 37 between the end of $\bar{\phi}$ and the beginning of $\phi1$ is extended. During this time period, the node 20 floats since $\bar{\phi}$ is off and the input $\phi1$ is low. In this condition the conduction state of the transistor 17 becomes indeterminate. Noise on the ground line may drive the source of the transistor 17 negative, turning it on and causing charge to be lost from the node 21. This tends to cause the voltage on the node 21 to drop below (Vdd-Vt), and if it does then the transistor 23 will conduct with the result being that the charge which should boot the node 22 high when $\phi1$ goes high, as seen by the line 22', will instead go through the transistor 23 into the node 21. Circuit operation can collapse rapidly because of a 2 Vt drop in the voltage to the node 29; this would occur if the node 22 is not booted high.

An additional problem is that the excessive power is dissipated through the series path of the transistors 34 and 36 when the input $\phi2$ comes on to reset the circuit. This occurs because the transistors 36 and 35 are turned on at the same time, causing the output nodes 13 and the node 29 to discharge simultaneously while leaving the transistor 34 in the triode region of operation so it continues to conduct during the discharge period.

Figure 3:
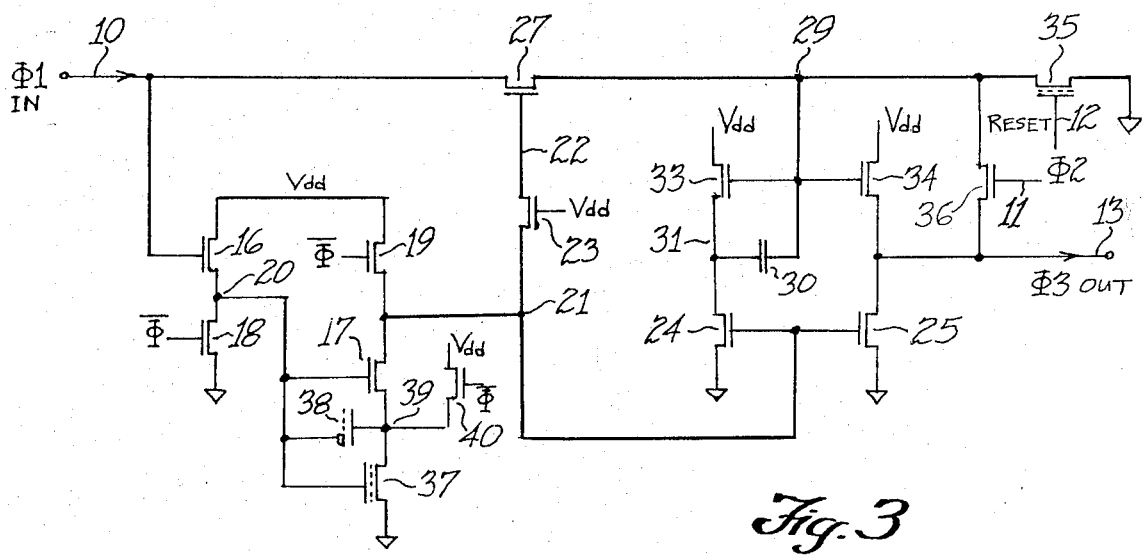
FIG. 3 is an electrical schematic diagram of a clock generator circuit according to the invention.

Turning now to FIG. 3, a clock generator circuit according to the invention is illustrated; this circuit eliminates disadvantageous features of the prior art circuit. The transistor 17 is connected to ground through a series transistor 37 having a gate driven by the node 20. A gated capacitor 38 connects a node 39 to the node 20, and this node 39 is precharged to (Vdd-Vt) by $\bar{\phi}$ through a transistor 40. The transistor 17 is kept cut off by precharging its source at the node 39 to (Vdd-Vt), which means that even if the node 20 floats and the transistor 37 is turned on by noise on Vss, the node 39 will have to be discharged all the way to ground before the transistor 17 could conduct. A threshold adjusting ion implant into the channel of the transistor 37 during manufacture raises the threshold voltage of this transistor to further increase the noise margin. Thus, the node 21 is well protected, and therefore the node 22 is protected from discharge, so one of the problems mentioned above is avoided.

The enhanced noise margin of the transistor 17 also results in better control over the delay time 14 through the delay circuit, and gives a more desired waveshape on the node 21, resembling the line 21a in FIG. 2d. The reason for this change is understood by reference to FIG. 2e, where the line 20' is the voltage on the node 20 as before, the line 21b is the voltage on the node 21, and the line 39' is the voltage on the node 39. Initially the nodes 21 and 39 are at (Vdd-Vt) and the node 20 is at ground. The Miller type capacitance consisting of the capacitor 38 is charged and as the node 20 begins to rise the capacitor 38 boosts the voltage on the node 39 until the transistor 37 is turned on. As the voltage on the node 20 continues to rise, the node 39 is discharged rapidly but the node 21 does not begin to discharge until the node 20 exceeds the voltage on the node 39 by a threshold voltage Vt. At this point, time 41 in FIG. 2e, the transistor 17 turns on and the node 21 discharges rapidly.

The circuit of FIG. 3 provides much lower power dissipation than the prior art circuit of FIG. 1. The power dissipation associated with resetting the driver stage is reduced by connecting the transistor 36 to ground through the node 29 and the transistor 35, rather than directly to ground as in FIG. 1. Also, the transistor 35 has an ion-implanted channel region to raise its threshold so that the noise margin for the node 29 is improved. With the connection of the transistor 36 of FIG. 3, the output 13 cannot be discharged until the gate voltage of the transistor 34 falls below the $\phi2$ reset voltage. The transistor 35 goes on first when $\phi2$ goes high, beginning to discharge the node 29, then later, when the voltage on the node 29 has dropped to a level lower than the voltage of $\phi2$ the transistor 36 comes on so the output 13 can begin to discharge. At this point the transistor 34 is cut off because its gate, node 29, is lower than its source or output node 13, and so no d.c. current path exists from Vdd to Vss in contrast to the situation in the FIG. 1 circuit.

Although the invention has been described with reference to a specific embodiment, this description is not meant to be construed in a limiting sense. Various modifications of the disclosed embodiment, as well as other embodiments of the invention, will become apparent to persons skilled in the art upon reference to this description. It is therefore contemplated that the appended claims will cover any such modifications or embodiments as fall within the true scope of the invention.

What is claimed is:

1. A clock generator circuit comprising: an input for receiving a reference clock voltage; a delay circuit connected to the input and producing a delayed voltage at an output; a driver circuit connected to receive said output and producing a high level delayed clock voltage; the improvement wherein the delay circuit includes a pair of controlled switching devices each having a current path and a control element, the current paths of the pair of switching devices being connected in series between said output and a reference potential, the control elements of the pair of switching devices being connected together and coupled to the input, means for separately precharging said output and a node between the current paths of the pair of switching devices prior to an operating cycle, the switching device having its current path connected between said node and reference potential having a higher threshold than the other of said pair of switching devices.

2. A circuit according to claim 1 wherein the pair of switching devices are insulated gate field effect transistors, the current paths are source-to-drain paths, and the control elements are gates.

3. A circuit according to claim 2 with an MOS capacitor connected between said node and the control elements of the switching devices.

4. A circuit according to claim 3 wherein the switching device having its current path connected between said node and reference potential is ion-implanted to provide a higher threshold voltage than the other switching device.

5. A circuit according to claim 2 wherein the delay circuit includes a third switching device having a source-to-drain path connected between a voltage supply and said control elements of the pair of switching devices and having a gate connected to said input.

6. A circuit according to claim 5 wherein means are provided for discharging said control elements of said pair of switching devices at a time prior to an operating cycle.

7. A circuit according to claim 6 wherein said driver circuit produces said high level delayed clock voltage at an output terminal, and includes a load transistor with a source-to-drain path connected between a high voltage node and said output terminal, and wherein said input is coupled to said high voltage node in the driver circuit by the source-to-drain path of a fourth switching device, the gate of the fourth switching device being connected to said output by an isolating device.

8. A circuit according to claim 7 wherein the gate of the fourth switching device discharges through the isolating device when the voltage on the output of the delay circuit decreases below a predetermined level, the high voltage node in the driver circuit being isolated from said input when said gate of the fourth switching device is discharged.

9. A circuit according to claim 6 wherein all of the means for precharging are field effect transistors having their gates connected to a clock signal which terminates prior to said reference clock.

* * * * *